United States Patent

Poon et al.

Patent Number: 5,254,873
Date of Patent: Oct. 19, 1993

[54] TRENCH STRUCTURE HAVING A GERMANIUM SILICATE REGION

[75] Inventors: Stephen S. Poon; Papu D. Maniar, both of Austin, Tex.

[73] Assignee: Motorola, Inc., Schaumburg, Ill.

[21] Appl. No.: 962,546

[22] Filed: Oct. 19, 1992

Related U.S. Application Data

[62] Division of Ser. No. 803,930, Dec. 9, 1991, Pat. No. 5,190,889.

[51] Int. Cl.$^5$ .............. H01L 27/02; H01L 23/48
[52] U.S. Cl. .................... 257/751; 257/394; 257/622; 257/640
[58] Field of Search ........... 257/394, 622, 640, 751

[56] References Cited

U.S. PATENT DOCUMENTS

| | | | |
|---|---|---|---|
| 4,417,914 | 2/1986 | Lehrer | 437/238 |
| 4,534,824 | 8/1985 | Chen | 257/629 |
| 4,571,819 | 2/1986 | Rogers et al. | 437/62 |
| 4,589,193 | 5/1986 | Goth et al. | 257/648 |
| 4,630,343 | 12/1986 | Pierce et al. | 437/67 |
| 4,630,356 | 12/1986 | Christie et al. | 437/69 |
| 4,631,803 | 12/1986 | Hunter et al. | 437/67 |
| 4,656,497 | 4/1987 | Rogers et al. | 257/397 |
| 4,671,970 | 6/1987 | Keiser et al. | 437/61 |
| 4,692,992 | 9/1987 | Hsu | 437/67 |
| 4,740,480 | 8/1988 | Ooka | 437/61 |
| 4,791,073 | 12/1988 | Nagy et al. | 437/67 |
| 4,819,052 | 4/1989 | Hutter | 257/630 |
| 4,824,797 | 4/1989 | Goth | 437/67 |
| 4,897,709 | 1/1990 | Yokoyama et al. | 257/301 |
| 5,142,438 | 8/1992 | Reinberg et al. | 257/304 |
| 5,162,890 | 11/1992 | Butler | 257/306 |

*Primary Examiner*—Rolf Hille
*Assistant Examiner*—David Ostrowski
*Attorney, Agent, or Firm*—Keith E. Witek

[57] ABSTRACT

A trench structure (10) using germanium silicate. The trench structure (10) has a substrate material (12) and a hard mask material (14) that overlies the substrate material (12). An opening is formed in the hard mask material and the opening is used to form a trench (16) in the substrate material (12). The trench (16) has a sidewall portion and a bottom portion. A barrier (18 and 20) is formed overlying the bottom portion of the trench (16) and adjacent to the sidewall portion of the trench (16). A planar germanium silicate region (22) is formed overlying the barrier (18 and 20).

18 Claims, 2 Drawing Sheets

TRENCH STRUCTURE HAVING A GERMANIUM SILICATE REGION

This is a divisional of application Ser. No. 07/803,930, now U.S. Pat. No. 5,190,889 filed Dec. 9, 1991.

FIELD OF THE INVENTION

The present invention relates generally to semiconductor processing, and more particularly, to trench isolation technology.

BACKGROUND OF THE INVENTION

Shallow trench isolation and plug technology have been used in the semiconductor industry to reduce circuit topography and better isolate adjacent semiconductor devices. In the early stages of trench isolation technology, silicon dioxide ($SiO_2$) was used to form plug regions for trenches and various topographical structures.

$SiO_2$ trench plugs improved isolation and topography, but also created undesirable mechanical stress and strain in integrated circuits. $SiO_2$, due to the fact that it was nonconformal, could not fill narrow trenches or plugs. When $SiO_2$ is used to form plugs in narrow trenches or trenches with a high aspect ratio, a known and undesirable phenomenon called crevice formation occurs. The compatibility of materials with narrow trenches or plugs is important because narrow trenches and plugs are becoming widely used as integrated circuit cell sizes decrease and photolithographic minimum geometry sizes shrink. Another disadvantage of the use of $SiO_2$ for trench plugs is that $SiO_2$ formations and layers cannot be reflowed and therefore are less planar than desired.

Due to the fact that $SiO_2$ could not be reflowed, boro-phosphate-silicate-glass (BPSG) was proposed as a plug fill material. BPSG is capable of being reflowed in a desirable planar manner for use as a plug material. Improved planarization helped to reduce the topography of plug etch processing. Although BPSG was capable of being reflowed, BPSG is a doped material. The dopant atoms in BPSG, phosphorus and boron, are mobile and can outwardly diffuse at higher temperatures. Therefore, when subsequent process steps occur, boron and phosphorus penetrate adjacent areas and are the cause of various problems such as threshold voltage shifting, reduced isolation, and oxide contamination. In addition, BPSG reduced trench mechanical stress and strain when compared to $SiO_2$, but the levels of BPSG stress and strain are still above desired trench stress levels.

SUMMARY OF THE INVENTION

The previously mentioned disadvantages are overcome and other advantages achieved with the present invention. In one form, the present invention comprises a trench structure and a process for forming the trench structure wherein a substrate material is provided. A hard mask material is provided overlying the substrate, and the hard mask material has an opening that exposes a portion of the substrate material. A portion of the substrate material exposed by the opening is removed. The removal of the portion of the substrate material forms a trench in the substrate material. The trench has a sidewall portion and a bottom portion. A barrier layer is formed from at least one material and the barrier layer overlies the bottom portion of the trench. The barrier layer is also adjacent the sidewall of the trench. A region of germanium silicate material is formed wherein the region of germanium silicate material is overlying and adjacent to the barrier layer.

The present invention will be understood by one skilled in the art from the detailed description below in conjunction with the accompanying drawings.

DESCRIPTION OF THE PREFERRED EMBODIMENT

Figure 1A:
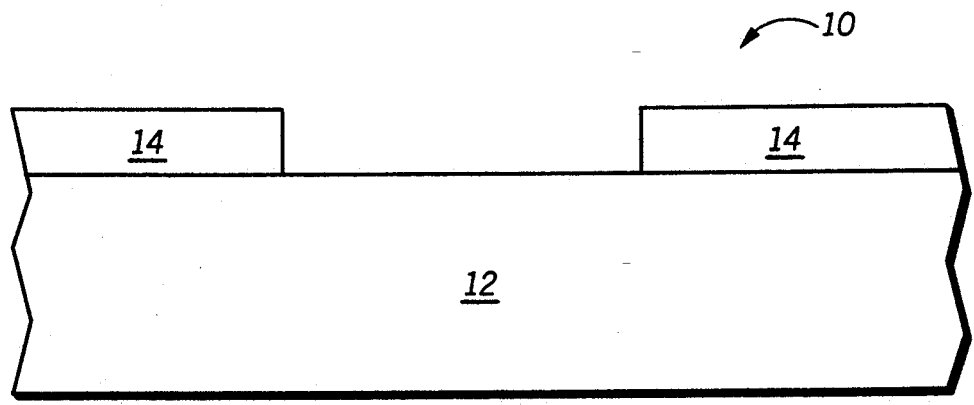
FIGS. 1A-1C illustrate, in cross-sectional form, a process for forming a trench structure in accordance with the present invention.
Figure 1B:
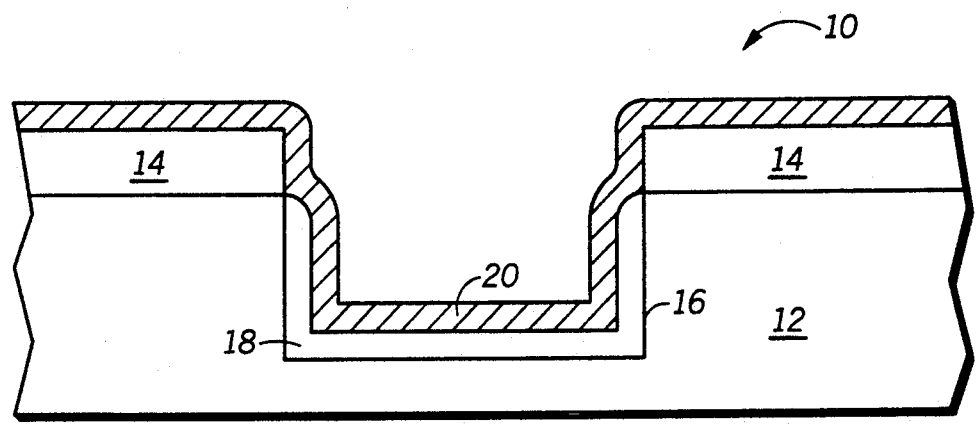
Figure 1C:
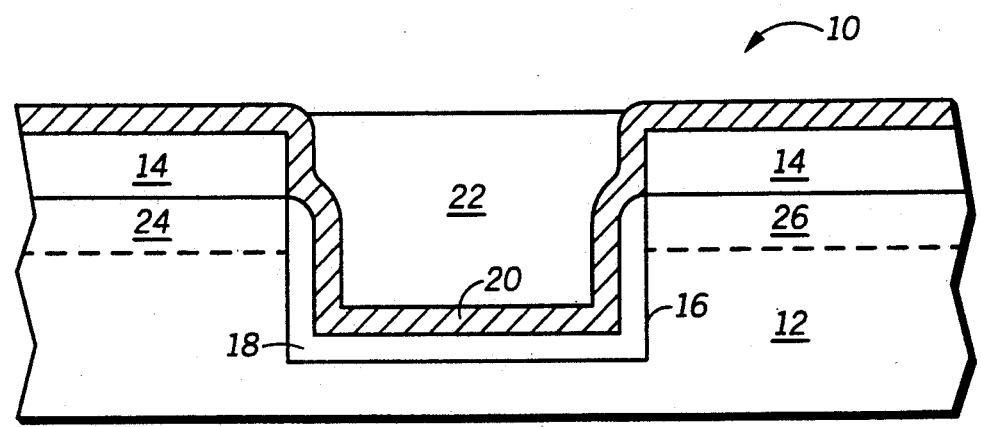

Illustrated in FIGS. 1A-1C is a formation of a trench isolation structure 10. Structure 10 has a substrate material 12, which is for most cases silicon, as illustrated in FIG. 1A. Substrate material 12 is not limited to silicon and can be any semiconductive material such as gallium-arsenide, germanium, epitaxial formations, and the like. A hard mask material 14 is grown or deposited overlying the substrate material 12. The hard mask material 14 is most likely either a dielectric material such as silicon dioxide ($SiO_2$), a film made via tetraethyl-ortho-silicate (TEOS) processing, a nitride, tantalum pentoxide ($Ta_2O_5$), boro-phosphate-silicate-glass (BPSG), polysilicon, or the like. In one form, the hard mask material 14 may be formed with an oxide upper portion, a polysilicon middle portion, and an oxide lower portion. In addition, the hard mask material 14 may be formed with an oxide lower portion, a nitride middle portion, and an oxide upper portion.

Conventional masking, photoresist deposition, developing, and etch steps are used to form an opening or a hole in the hard mask material 14 as illustrated in FIG. 1A. This opening exposes a portion of the substrate material 12. As used herein, any subsequent reference to the phrase "exposed portion of the substrate material 12" is intended to mean the portion of substrate material 12 that is underlying the opening in the hard mask material 14. The exposed portion of substrate material 12 is more accessible to subsequent processing steps than other portions of the substrate material 12 that are covered by the mask material 14. Native substrate oxides (not illustrated) and other layers (not illustrated) may subsequently cover the exposed portion of the substrate material 12, but the previously exposed portion of the substrate material 12 will still be less protected than portions of the substrate material 12 underlying the hard mask material 14.

A trench etch step is used to etch a trench 16 into the substrate material 12 as illustrated in FIG. 1B. The trench 16 has a bottom portion and a sidewall portion. It should be well understood that trench 16 may be circular, rectangular, a straight line, or any two-dimensional geometric shape when viewed from a top perspective. A first dielectric layer 18 is grown or deposited in the trench along the bottom of the trench 16 and adjacent the sidewall of the trench 16. The first dielectric layer 18 is usually made of $SiO_2$ or a like material. A second dielectric layer 20 is deposited overlying the first dielectric layer 18. The second dielectric layer 20 is usually made of nitride or a like material.

The first and second dielectric layers 18 and 20 together form a barrier of protection within the trench region between the substrate material 12 and subsequent layers. The barrier layer can be made up of one layer of material or a plurality of layers of material. A preferred barrier layer embodiment is presented herein and is a stacked $SiO_2$/nitride dielectric combination. In general, the first dielectric layer 18 is formed to provide a more robust interface between the substrate material 12 and subsequent layers (which will be subsequently illustrated and discussed) by reducing the defect density of known and understood traps in the substrate material 12. The second dielectric layer 20 acts as an oxidation shielding barrier so that the trench structure does not further oxidize during subsequent processing and cause unnecessary mechanical stress.

Once the barrier is formed from dielectric layers 18 and 20, a layer of germanium silicate (not illustrated) is formed overlying the second dielectric layer 20. In one form, the layer of germanium silicate is formed through the use of CVD processing, spin on glass technology, deposition and reflow techniques, sputtering processing, or the like. If needed, additional processing can be used to ensure that the layer of germanium silicate is as planar as possible.

Once a layer of germanium silicate is formed, a selective etch step is used to form a germanium silicate region 22, as illustrated in FIG. 1C. Germanium silicate region 22 is usually planar with respect to a substrate surface to improve overall circuit topography. If the hard mask 14 is left overlying the substrate material 12 for a duration of the trench process, as illustrated, the germanium silicate region 22 will be planar with respect to the hard mask 14 and reduce overall circuit topography.

Figure 2:
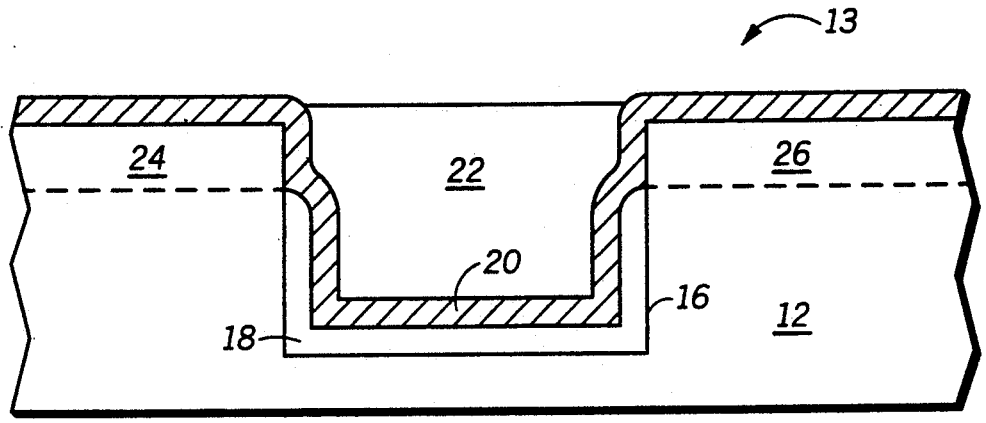
FIG. 2 illustrates, in cross-sectional form, an alternative trench structure in accordance with the present invention.

At several points in the process of FIGS. 1A-1C, the hard mask material 14 or portions of the hard mask material 14 can be removed. This hard mask 14 removal followed by a trench plug process flow results in a process and resulting structure that is very similar to that of FIGS. 1A-1C. Because the process is very similar, with the main difference being the removal of the hard mask material 14, only the resulting device and not the process flow is illustrated in FIG. 2. FIG. 2 illustrates a structure 13 having a trench formation nearly identical to structure 10 of FIG. 1. Therefore, analogous elements are identically numbered in FIG. 1 and FIG. 2. The difference between structures 10 and 13 is that the structure 13 has a germanium silicate region 22 surface that is planar and nearly level to the substrate material 12. Structure 10 has a germanium silicate region 22 surface that is planar and nearly level to the hard mask material 14, as illustrated in FIG. 1C. In most cases, the hard mask material 14 is removed, and therefore the structure 13 may result in a planar integrated circuit that is more planar than structure 10 for some applications. In some cases, the hard mask material 14 can remain on the substrate material and serve other purposes. For these hard mask applications, FIG. 1C will, most likely, be more applicable.

In addition, the structure 10 or 13 can be used to isolate a single integrated circuit device or a plurality of integrated circuit devices from each other. FIG. 1C illustrates substrate regions 24 and 26. Substrate regions 24 and 26 are portions of the substrate material 12 that have been arbitrarily chosen to illustrate the placement of integrated circuit devices with respect to the structures 10 and 13. Substrate region 24 can hold either a first integrated circuit device (not illustrated) or a plurality of devices (not illustrated) and substrate region 26 can hold either a second integrated circuit device (not illustrated) or a plurality of devices (not illustrated). These devices can be diodes, capacitors, MOS transistors, bipolar transistors, logic gates, memory cells, output drivers, adders, or any circuit device, component or design that is semiconductor compatible. The device or devices within substrate region 24 are isolated from the device or devices within substrate region 26 by the trench structure 10 or 13. The improved isolation occurs for two main reasons. Due to the fact that the devices are now separated physically by a high dielectric trench region, isolation is improved. In addition, the physical distance through the substrate material 12 between device(s) in region 24 and device(s) in region 26 is greater. This greater substrate distance between devices improves device isolation.

The use of germanium silicate region 22 for trench isolation has several advantages over conventional technology such as: (1) reduced or eliminated trench and substrate wafer stress; (2) no possibility for adverse doping penetration (which occurs for BPSG); (3) better planarization properties than conventional techniques; and (4) better narrow trench coverage than conventional technology.

By controlling the concentration of germanium (Ge or $GeO_2$) within the germanium silicate region 22, varying degrees of stress can be achieved. The stress alteration occurs due to the fact that Ge concentration in germanium silicate directly affects the thermal coefficient of expansion of the germanium silicate ($GeO_2$/$SiO_2$). Between tensile stress, wherein the trench would tend to expand, and compressive stress, wherein the trench would tend to collapse, is an equilibrium stress level, wherein the trench is not exerting or receiving any mechanical stress at all. This equilibrium stress level is attainable with Ge doping in the range of 20% to 50% $GeO_2$ concentration for an embodiment with a silicon substrate. In addition, due to the fact that Ge is a valence four semiconductive element, the undesirable doping penetration that occurs for a BPSG plug does not occur for germanium silicate formations.

In order to make the germanium silicate material more robust, a structure 10 heat cycle in the range of 500° C. to 1200° C. is performed to anneal the germanium silicate material.

Figure 3:
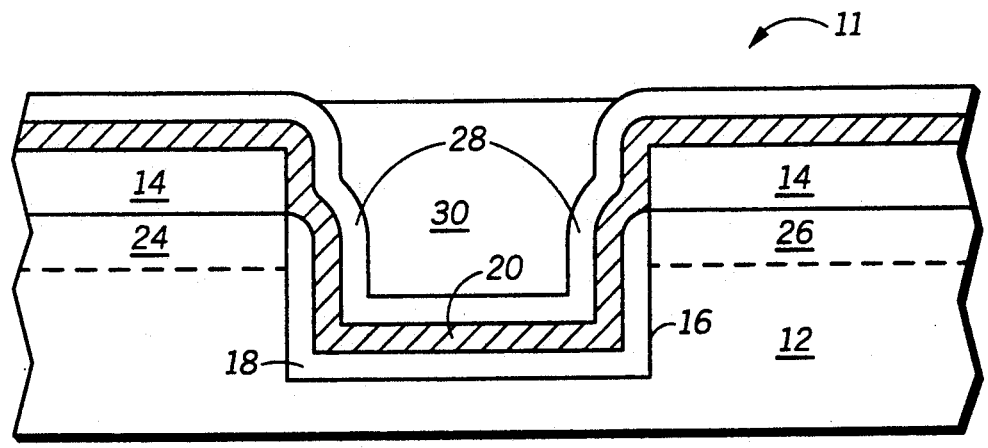
FIG. 3 illustrates, in cross-sectional form, yet another alternative trench structure in accordance with the present invention.

FIG. 3 illustrates an alternative embodiment of a trench isolation structure 11 which is similar to structure 10. Due to the fact that the structures 10 and 11 are similar, analogous regions are identically labeled and the entire process flow for device 11 will not be discussed in detail. It is important to note that all of the flexibility and options discussed for structure 10 will apply to structure 11.

Instead of a germanium silicate plug, a germanium silicate layer 28 is formed overlying the barrier. The barrier for structure 10 is identical to structure 11 and is formed by the dielectric layers 18 and 20. The germanium (Ge) concentration of the germanium silicate layer 28 can be altered to change the stress properties in a manner similar to structure 10. A planar layer 30 is formed overlying the germanium silicate layer 28. The planar layer 30 can be an intrinsically planar layer such as a spin on glass or can be a reflowed material, a chemically and/or mechanically planarized material, a CVD and etchback formed material, or the like. The planar layer 30 is etched back to form a planar plug that is substantially level with a surface of the germanium silicate layer 28. The planar top layer is typically a dielectric material such as $SiO_2$, BPSG, nitride, and/or the like. Structure 11 allows for some stress alternation by varying the concentration of germanium (Ge) in the germanium silicate layer 28. Structure 11 also relies on current process techniques of reflow, etchback, spin on glasses, CVD, and the like to for a plug region. The structure 11 may therefore have various advantages relating to process integration and process compatibility.

While the present invention has been illustrated and described with reference to specific embodiments, further modifications and improvements will occur to those skilled in the art. For example, many different materials can be used to form the barrier layers. For different types of substrates, many different germanium doping schemes and concentrations will be necessary to achieve optimal stress reduction results. The hard mask can be removed or function as an integral part of the device. Trench isolation structures can isolate one single device or several devices from each other. Trench isolation can be formed overlying the substrate to isolate substrate-overlying conductive layers and substrate-overlying structures from each other. It is to be understood, therefore, that this invention is not limited to the particular forms illustrated and that it is intended in the appended claims to cover all modifications that do not depart from the spirit and scope of this invention.

We claim:

1. A trench structure comprising:
   a substrate material having a surface;
   a trench formed in the substrate material, the trench having a sidewall portion and a bottom portion;
   a first barrier layer overlying the bottom portion of the trench and being adjacent the sidewall portion of the trench;
   a second barrier layer overlying the first barrier layer, the second barrier layer having a first surface which lies outside the trench and is substantially parallel to the surface of the substrate material, the second barrier layer having a second surface which lies within the trench; and
   a region of germanium silicate ($GeO_2/SiO_2$) material overlying the second barrier layer and adjacent the second barrier layer, the region of germanium silicate material covering the second surface of the second barrier layer and exposing the first surface of the second barrier layer.

2. The trench structure of claim 1 wherein the region of germanium silicate material is substantially planar.

3. The trench structure of claim 1 wherein the first barrier layer is made of silicon dioxide and the second barrier layer is made of nitride.

4. The trench structure of claim 1 wherein the region of germanium silicate is a layer of germanium silicate material and the trench structure further comprises a plug region which overlies the layer of germanium silicate material.

5. The trench structure of claim 4 wherein the plug layer is substantially planar.

6. The trench structure of claim 1 wherein the trench structure further comprises a hard mask material that overlies the substrate material, the hard mask material having an opening for forming the trench structure.

7. A trench isolation structure comprising:
   a silicon substrate material having a surface;
   a hard mask material overlying the silicon substrate material, the hard mask material having an opening which exposes a portion of the silicon substrate material;
   a trench within the silicon substrate material, the trench having a sidewall portion, a bottom portion, and a geometric shape defined by the opening;
   a first dielectric barrier overlying the bottom portion of the trench and being adjacent the sidewall portion of the trench, the first dielectric barrier being an oxide material;
   a second dielectric barrier overlying the first dielectric barrier, the second dielectric barrier being made of a non-oxidizing material and having a top surface which is substantially parallel to the surface of the silicon substrate material; and
   a plug region of germanium silicate ($GeO_2/SiO_2$), the plug region of germanium silicate ($GeO_2/SiO_2$) overlying the second dielectric barrier, the plug region of germanium silicate ($GeO_2/SiO_2$) exposing said top surface of the second dielectric barrier.

8. The trench isolation structure of claim 7 wherein the first dielectric barrier is silicon dioxide and the second dielectric barrier is a nitride material.

9. The trench isolation structure of claim 7 wherein the plug region of germanium silicate material is substantially planar.

10. The trench structure of claim 7 wherein the hard mask material comprises:
    an oxide lower portion of the hard mask material;
    a nitride middle portion of the hard mask material; and
    an oxide upper portion of the hard mask material.

11. The trench structure of claim 7 wherein the hard mask material comprises:
    an oxide lower portion of the hard mask material;
    a polysilicon middle portion of the hard mask material; and
    an oxide upper portion of the hard mask material.

12. The trench structure of claim 7 further comprising:
    a dielectric plug layer formed at least partially within the trench and overlying the plug region of germanium silicate.

13. A trench structure comprising:
    a substrate material;
    at least one trench in the substrate material having a sidewall portion and a bottom portion;
    a dielectric barrier, the dielectric barrier overlying the bottom portion of the trench and being adjacent the sidewall portion of the trench; and
    a substantially planar region of germanium silicate (germanium oxide/silicon oxide) material which overlies the dielectric barrier and is adjacent the dielectric barrier, the region of germanium silicate (germanium oxide/silicon oxide) material being formed only within a portion of the at least one trench.

14. The trench structure of claim 13 further comprising:
    a hard mask material overlying the substrate material and positioned laterally adjacent the at least one trench.

15. The trench structure of claim 14 wherein the hard mask material further comprises:
    an oxide lower portion of the hard mask material;

a nitride middle portion of the hard mask material; and an oxide upper portion of the hard mask material.

16. The trench structure of claim 14 wherein the hard mask material further comprises:

an oxide lower portion of the hard mask material;

a polysilicon middle portion of the hard mask material; and an oxide upper portion of the hard mask material.

17. The trench structure of claim 13 wherein the dielectric barrier comprises:

an oxide lower portion of the dielectric barrier; and a silicon nitride upper portion of the dielectric barrier.

18. The trench structure of claim 13 further comprising:

a dielectric plug layer formed at least partially within the at least one trench and overlying the substantially planar region of germanium silicate material.

* * * * *